United States Patent [19]

Skroupa

[11] 4,277,815
[45] Jul. 7, 1981

[54] REPLACEABLE AIR SEAL FOR FORCE COOLED REMOVABLE ELECTRONIC UNITS

[75] Inventor: James D. Skroupa, Ellicott City, Md.

[73] Assignee: Westinghouse Electric Corp., Pittsburgh, Pa.

[21] Appl. No.: 49,007

[22] Filed: Jun. 15, 1979

[51] Int. Cl.³ .............................................. H05K 7/20
[52] U.S. Cl. .................................... 361/383; 361/415
[58] Field of Search ............................... 361/381–384, 361/395, 415; 174/15 R, 16 R; 165/80; 277/9

[56] References Cited

U.S. PATENT DOCUMENTS

| | | | |
|---|---|---|---|
| 3,382,476 | 5/1968 | Novet | 339/65 |
| 3,495,132 | 2/1970 | Anhalt | 361/384 |
| 4,107,760 | 8/1978 | Zimmer | 361/383 |

*Primary Examiner*—Gerald P. Tolin
*Attorney, Agent, or Firm*—E. F. Possessky

[57] ABSTRACT

A rubber seal vulcanized to a removable strip is shown for forming a replaceable air seal for a plug-in printed circuit board or the like which is removeably mounted in a frame. The rubber seal defines upwardly outwardly extending sealing lips in a configuration having generally parallel sides and closed ends and dimensioned to sealingly engage the opposed facing surfaces of a pair of pre-assembled spaced circuit boards having the electrical components mounted thereon disposed in the space therebetween. The strip supporting the rubber seal is slidably received within machined grooves in opposed facing mounting plate members for the boards. Apertures in the opposed mounting plates and apertures in the strip are in alignment therewith when the strip is properly inserted within the plates. The rubber seal surrounds the aperture of the strip and seals against the opposed facing boards and attached supports to direct cooling air into the space between the boards through the aligned apertures. As the rubber sealing lips become damaged through repeated removal and reinsertion of the board pair assembly, the seal is readily replaced by removing and inserting a new strip having a seal bonded thereto.

5 Claims, 8 Drawing Figures

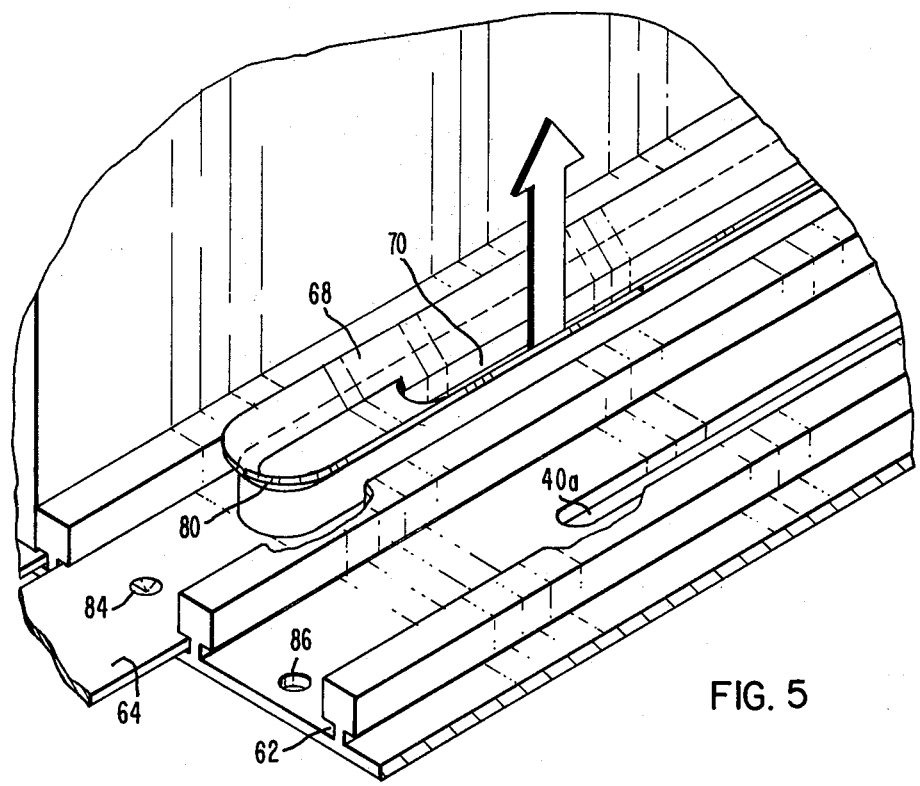
FIG. 5
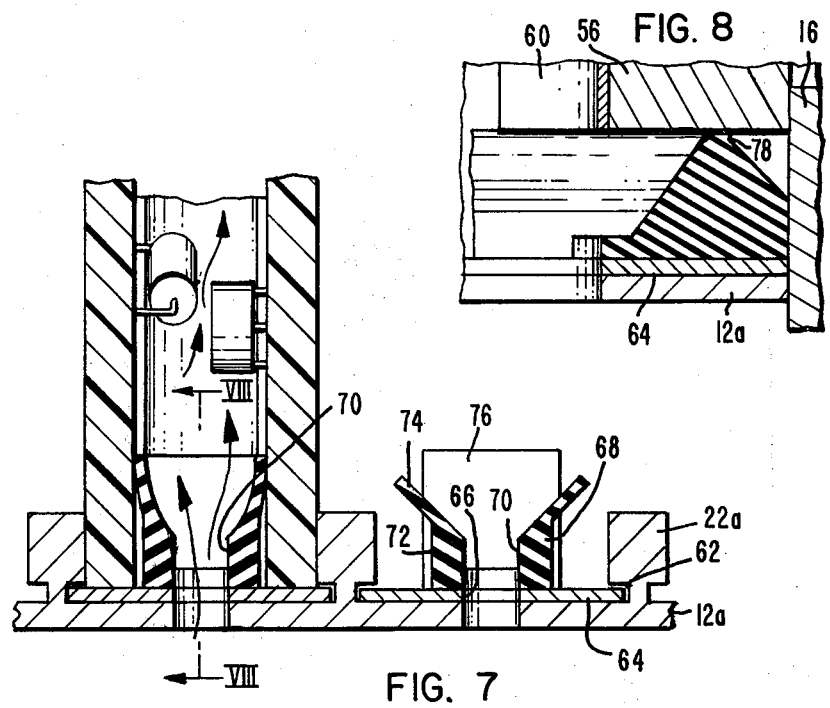
FIG. 8
FIG. 7

REPLACEABLE AIR SEAL FOR FORCE COOLED REMOVABLE ELECTRONIC UNITS

GOVERNMENT CONTRACT

The Government has rights in this invention pursuant to Contract No. F19628-70-C-0218 awarded by the U.S. Air Force.

BACKGROUND OF THE INVENTION

1. Field of the Invention

This invention relates to an air seal for sealingly engaging a printed circuit board to deliver cooled air across electrical components mounted thereon and more particularly to a removable air seal which is easily replaced as it becomes damaged.

2. Description of the Prior Art

It is common practice to mount printed circuit boards in a frame wherein the boards are removably retained in side-by-side array in generally parallel planes. The boards are spaced from one another to provide clearance for the electrical elements that are mounted on each board. Operation of the circuit of each board produces heat, which at least in the generally large arrays of circuit boards, must be dissipated or the components would overheat. Thus, it is also common to direct cooling air between the spatially separated circuit boards to provide a means of removing the heat. Further, it is not uncommon for such array to be used in an environment, such as an airplane, where the amount of cooling air is rather limited and thus its effect must be optimized.

As more clearly explained in reference to the figures describing the prior art, it has been common practice to pre-assemble two adjacent circuit boards in spatially separated orientation with the surfaces of each board on which the electrical components are mounted in facing arrangement. This permits the cooling air to be directed between the two boards to cool the components of each board. The assembled board pairs are then removably mounted in a frame with each pair bridging an elongated opening therein that permits cooling air to be fed therebetween. Flexible seals are provided, between the inner face of the boards and the elongated aperture in the base plate of the frame through which the air flows, to provide a seal between the air opening and the interior space to limit cooling air leakage. However, after repeated removal and replacement of the paired board assembly, as for checking and/or repair, the flexible stationarily mounted seals become damaged to the extent it is necessary to replace them. Heretofore, this has essentially required the replacement of the plate member on which the seals are attached which in turn could result in the removal of all boards and the replacement of all seals even though only the replacement of a few seals is required. Alternatively, the repair could be made by removal of sufficient number of paired circuit boards from the frame to permit replacement of individual seals by forcefully removing the seals from their supposedly permanent attachment to the frame plate and re-gluing new seals in their position, all of which is relatively laborious and time consuming.

SUMMARY OF THE INVENTION

The invention provides a replaceable air seal of a silicon rubber bonded (i.e. as by vulcanizing) to a planar strip of material which in turn is slideably received in a tongue-and-groove arrangement for retention in the opposed supporting plates of the frame which mount the aligned circuit boards. The strip has an elongated aperture corresponding to and, when assembled in the plate, generally coterminous with, the air openings in the plates. As before, the seals seal the air opening to the interior space of a pair of pre-assembled spatially separated circuit boards (hereinafter called a board pair assembly). Each strip is slid into its position and is retained therein so as not to be displaced by removal or insertion of the board pair assembly however, upon becoming ineffective as a seal, each single strip is readily removed and replaced by an effective seal on a new strip.

BRIEF DESCRIPTION OF THE DRAWINGS

FIG. 5 is an enlarged view of FIG. 4 showing generally one end of the air seal of the present invention;

FIG. 7 is a cross-sectional elevational view taken generally along lines VII—VII of FIG. 6; and FIG. 8 is a cross-sectional elevational view taken generally along lines VIII—VIII of FIG. 7.

DESCRIPTION OF THE PREFERRED EMBODIMENT

Figure 1:
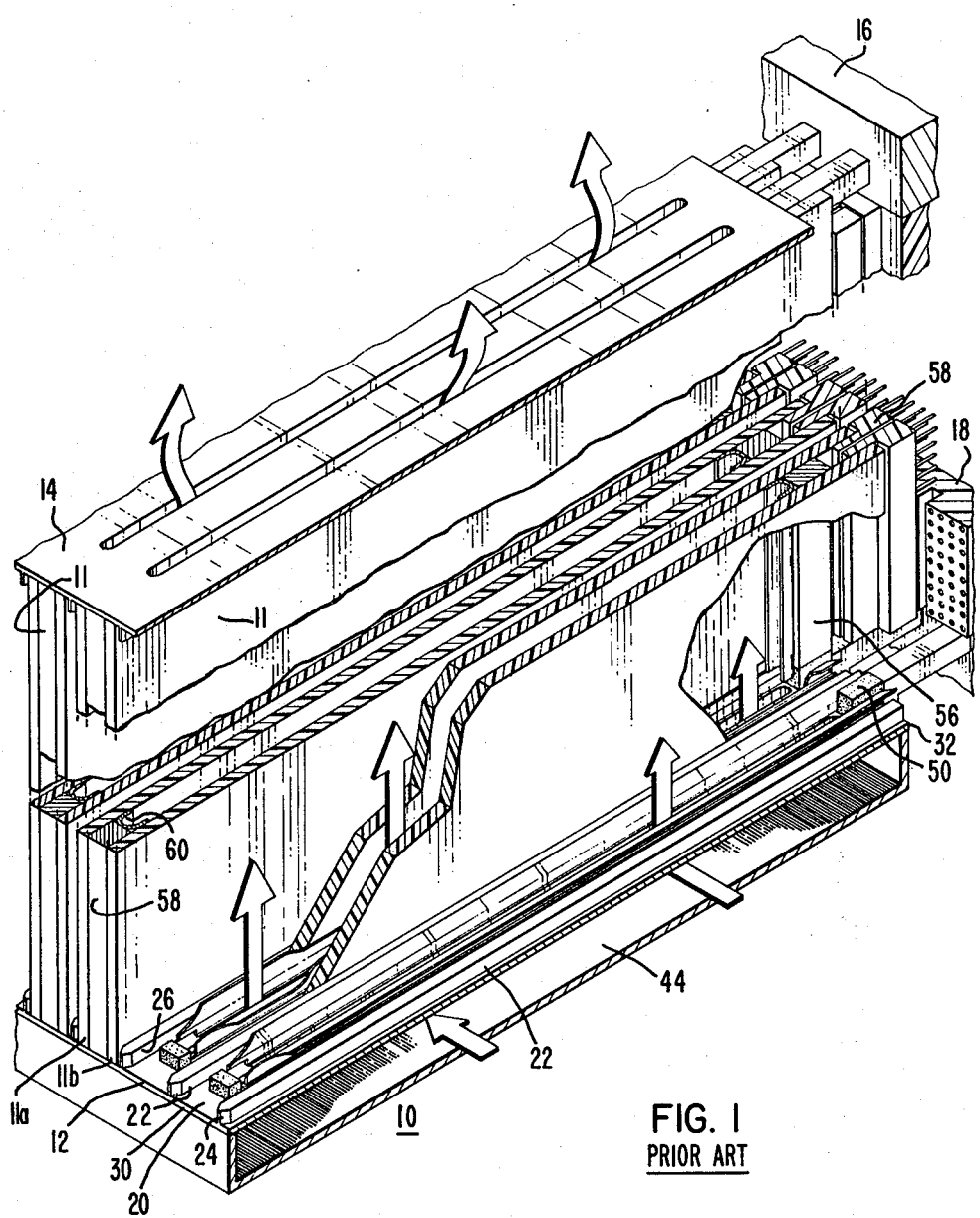
FIG. 1 is an isometric view of paired circuit boards removably mounted within a frame with portions broken away to show the air seal of the prior art.
Figure 2:
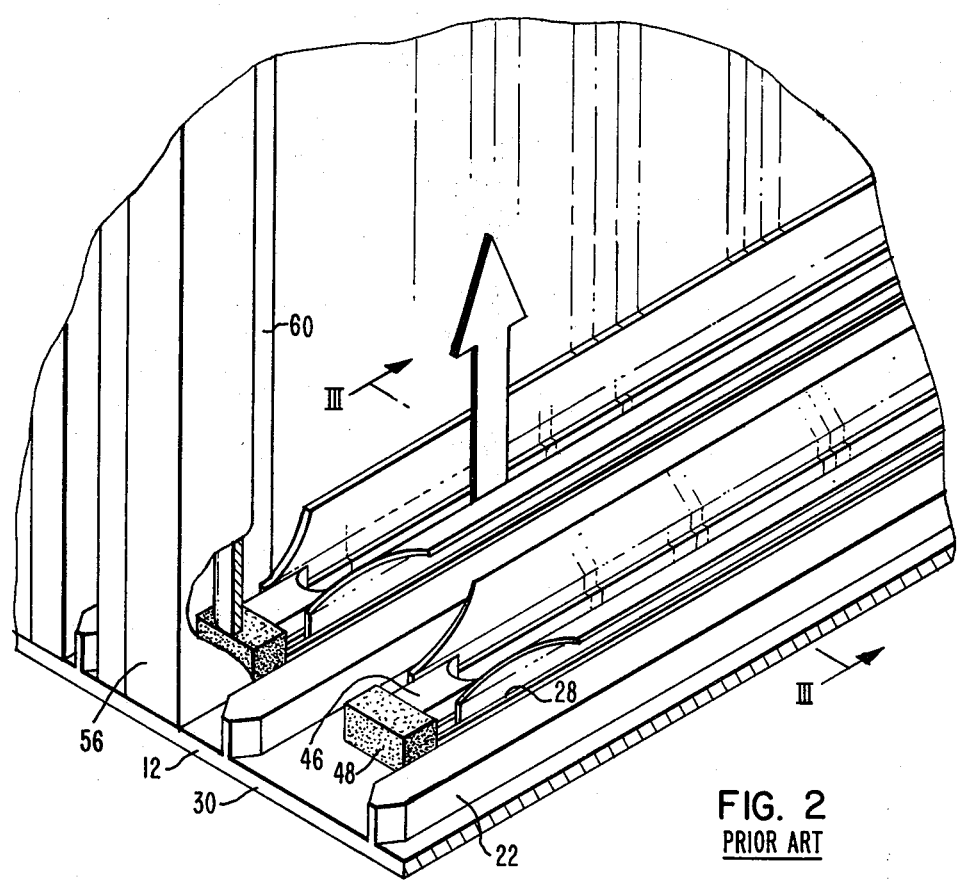
FIG. 2 is an enlarged isometric view of a portion of FIG. 1 and again showing the prior art air seal.
Figure 3:
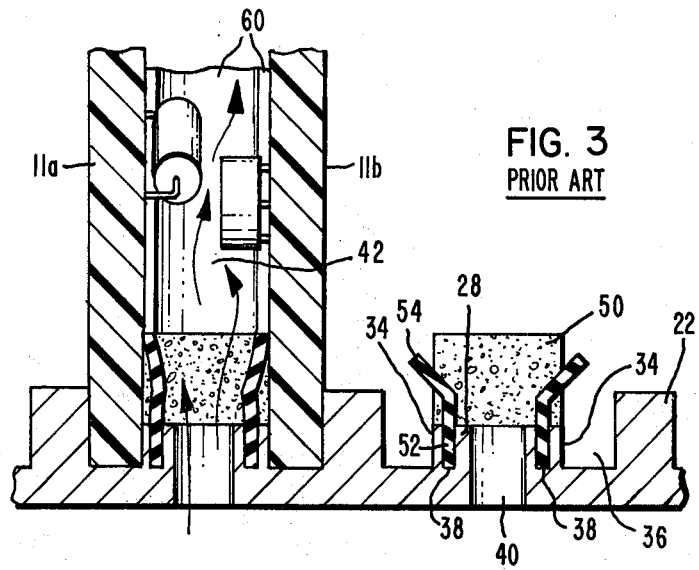
FIG. 3 is a cross-sectional view taken generally along lines III—III of FIG. 2 showing details of the prior art air seal arrangement.
Figure 4:
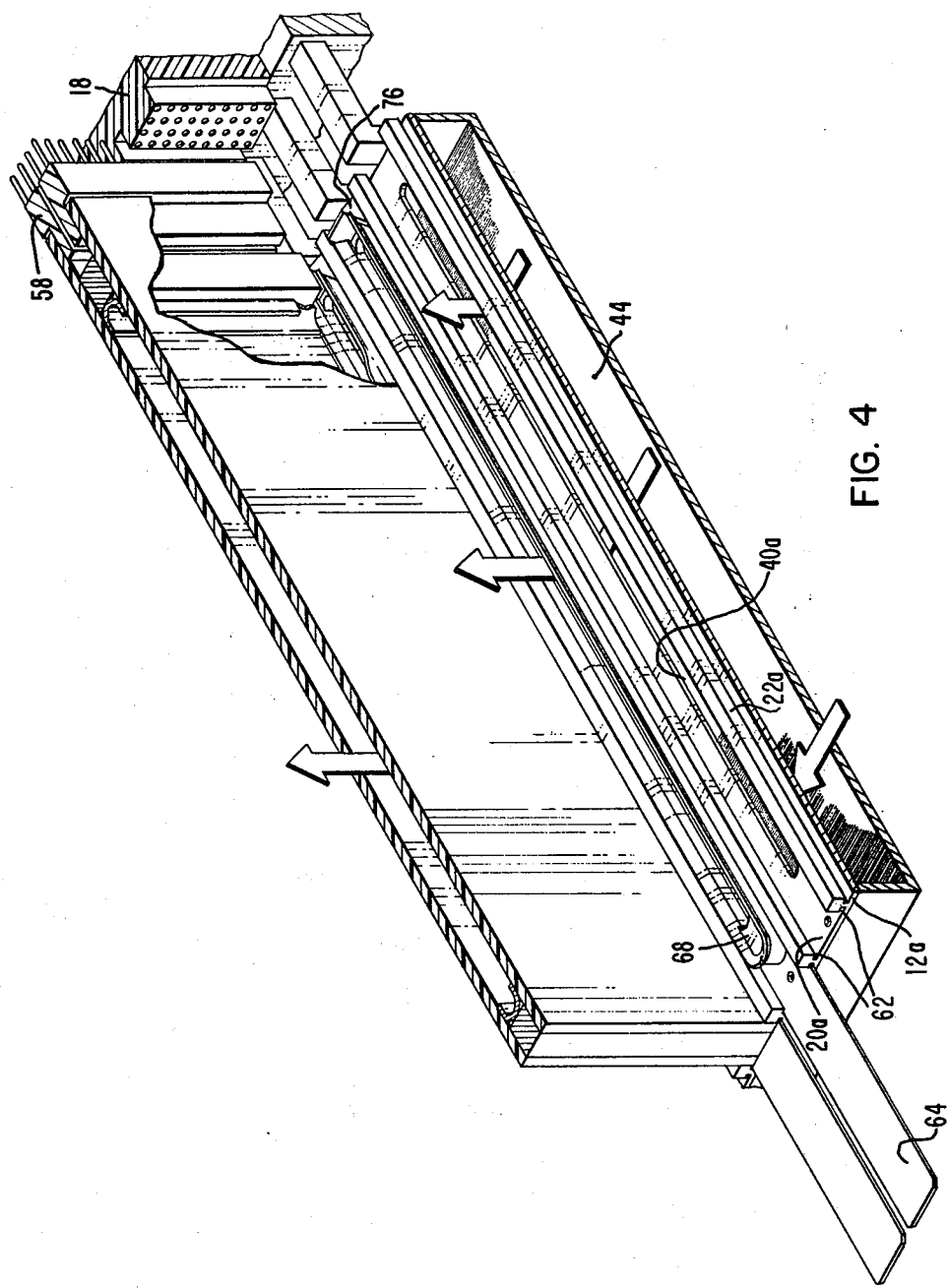
FIG. 4 is an isometric view similar to FIG. 1 showing the replaceable air seal of the present invention.
Figure 6:
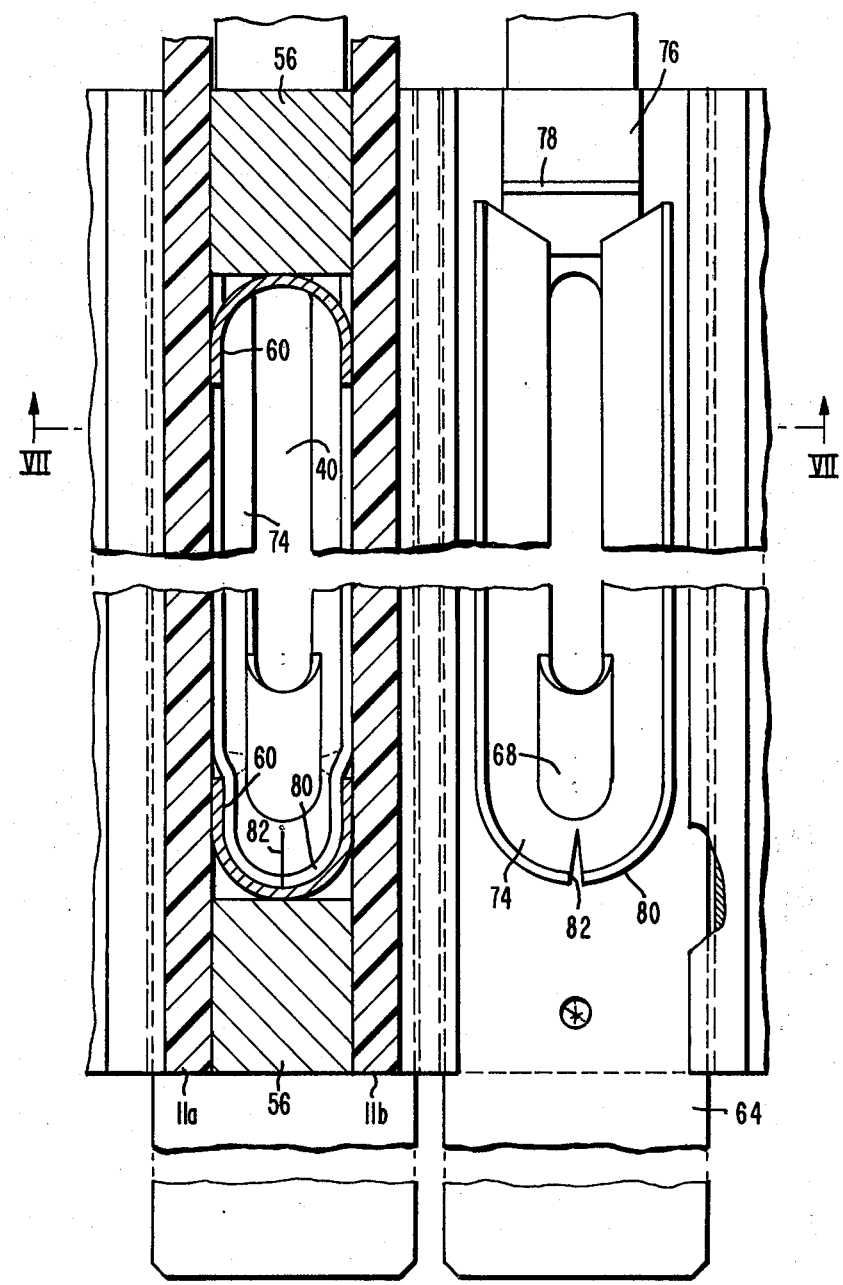
FIG. 6 is a top view of adjacent air seals of the present invention mounted in the frame and showing one air seal engaging a board pair assembly and one seal available to receive a board pair assembly.

Referring to FIGS. 1 through 3, a typical printed circuit board and mounting frame assembly for a modular electronic system is shown along with an air seal arrangement which is illustrative of the prior art as heretofore generally described. Thus it is seen that the modular system 10 for receiving pluggable, removable circuit board assemblies 11 includes a pair of spaced, opposed generally horizontal rectangular plates 12, 14 with the upper plate 14 being generally a duplicate of the lower plate 12 and thus the description of plate 12 will be sufficient to describe both plates. The plates are mounted in any well known manner and form a part of a frame 16 which, at one end supports a plurality of vertically oriented electrical connectors 18 for connection to the apparatus being operated or controlled through the circuits of the board assemblies 11 of this system. The opposed facing surfaces of the plates 12, 14 define aligned circuit board receiving channels 20 sized to slidably receive a pair of circuit boards 11a, 11b, pre-assembled in a spaced facing relationship, as explained subsequently, with the electrical components (see FIG. 3) mounted on each board disposed in the space provided between them. Each channel 20 for receiving the board pair assembly 11 is defined by a pair of ribs 22 extending the full width of the plate 12, 14 and having at the receiving end a tapered nose 24. The ribs are spaced so as to closely receive the board pair assembly therebetween with the rib face 26 closely adjacent the outside surface of the board pair assembly 11. An intermediate raised portion 28, inset from the receiving edge 30, extends substantially to the opposite edge 32 of the plates 12, 14 and projects upwardly a short distance (i.e. less than the height of the separating ribs 22) so that the sides 34 of the raised portion are in opposed facing relationship with an adjacent rib 22 and cooperates therewith to define a groove 36 sized to slidingly receive an individual circuit board 11a or 11b of the board pair assembly 11.

The intermediate portion 28 contains slits 38 throughout its length closely adjacent each side in the portion and also defines an elongated aperture 40 through the plates 12, 14 to place the space 42 between the boards 11a, 11b of the board pair assembly 11, as mounted therein, in cooling air flow communication with pressurized cooling air, such as from a plenum chamber 44 below the lower plate 12. The receiving end 46 of the raised intermediate portion 28 is seen to define an initial shoulder taller than the remaining portion and also has mounted adjacent its front face, a block 48 of sealing material for engaging in sealing relationship certain internal surfaces of the board pair assembly 11 (to be defined) when the assembly 11 is properly positioned between the plates 12, 14 and plugged into the connector 18. Likewise the opposite end of the raised portion 28 supports a block 50 of sealing material for sealing engagement with appropriate internal structure of the board pair assembly 11.

A thin strip of rubber or resilient material 52 is inserted into each slit 38 in the raised portion 28 and extends the length thereof. (Generally this requires depositing a bonding material in each slit and manually inserting one edge of the flexible rubber strip therein, which, upon curing of the bonding material, results in a relatively permanent attachment of the rubber seal within the slit.)

The strip 52 is pre-formed to, in its normal, unbiased position, provide a flap portion 54 extending outwardly toward and generally overlying the adjacent groove 36. It should be noted that upon insertion of a circuit board 11a, 11b into the groove 36, the flap 54 is deformed into a generally vertical configuration (see FIG. 3) with an inherent bias into a sealing relationship with the inner surface of the board.

As previously stated, the circuit boards 11a, 11b are pre-assembled into spaced facing pairs by being attached in a co-terminous relationship on vertical struts 56, generally adjacent each end. A vertical electrical plug-in connector 58 for mating with the connector 18 on the frame 16 is secured to each board along one vertical edge to, in the assembled arrangement, provide a common end for connection into the stationary connector 18. The internal facing surfaces of the struts 56 support vertical U-shaped members 60 extending generally the height of the associated strut. Also, it will be understood that the ends of the strut 56 adjacent the connector 58 are inset from the top and bottom edge of the board pair assembly to provide clearance over the intermediate raised portion 28 of the plates 12, 14; however, upon complete engagement of the plug-in connectors 58, 18, the ends of this strut 56 sealingly engage the sealing blocks 50 on the adjacent end of the raised portion 28. Likewise, the opposite strut 56 is of a vertical length to sealingly engage the sealing block 48 adjacent the receiving end of the intermediate portion 28.

Thus, with the circuit board pair assembly 11 in place as shown in these FIGS. (1-3), the rubber sealing strip 52 engages the inner facing surfaces of the boards 11a, 11b and the U-shaped vertical members are sealingly engaged by blocks 48, 50 to form a seal generally at the interface of the boards and their support plates 12, 14. The U-shaped vertical members complete the vertical seal of the space between the boards so that cooling air entering the slots 40 in the plate 12 is confined to flow in the space 42 between the assembled boards, cooling the electrical components within the space and exit through the top plate 14, for recirculation, or for continued circulation into the next upper adjacent similar circuit board mounting arrangement, with minimal air leakage.

However, after repeated removal and reinsertion of the pluggable board pair assembly 11, the flap portion 54 of the rubber seals 52 which extend out over the grooves 36 and are deformed by inserting the boards, sometimes get caught by the boards and are torn, or, over a period of time, become worn and damaged to the extent that they no longer provide the desired air seal with the surface of the boards. The repair of these individual bonded seals generally requires the circuit board assemblies to be removed for access to the plates 12, 14, and the rubber strip manually removed and the slit 38 cleaned, a bead of glue or bonding material deposited in the slit and a new rubber strip 52, cut to size, inserted and left sufficient time for the bonding material to dry before that seal can again be used. Also, the blocks 48, 50 of sealing material adjacent each end of the raised portion 28 for sealingly engaging the struts of the board pair assembly 11 becomes damaged and requires complete removal and replacement in a process similar to their original installation and, in the assembly, requires manually bonding them in the proper position. In all cases, both initially and especially for subsequent repair, the time for manual assembly is considerable and relatively expensive and during the repair process requires the electrical components associated therewith to be disconnected.

The air seal of the present invention is clearly shown in FIGS. 4 through 8 and as therein seen, the board pair assembly 11 remains unchanged as does the frame 16, however, the opposed support plates, only lower plate 12a being shown, define aligned channels 20a separated by raised ribs 22a extending across the width of the plate 12a. Each rib 22a is under-cut as at 62 flush with the lower surface of the channel 20a to provide a horizontal slit for slidingly receiving the longitudinal edges of a planar strip 64 having a width sufficient to extend across and into the opposed under-cut slits 62 in a sliding tongue-in-groove arrangement. Each channel 22a defines an elongated centrally disposed aperture 40a through the plate 12a and the planar strip 64 includes a like elongated aperture 66 for alignment therewith when the strip 64 is assembled in proper position by being slid within the slits 62 in the ribs 22a.

A rubber-like gasket member 68 such as a silicon rubber is bonded (i.e. as by vulcanization) directly to one planar side of the strip 64 surrounding the aperture 66 and itself defines an aperture 70 co-terminous with the aperture 66 in the strip 64. The gasket member 68 also defines, as a typical cross-section along generally three sides of the elongated aperture (i.e. the two opposing lengthwise sides and the arcuate nose portion 80 adjacent the board receiving end of the gasket 68 as it is disposed within the plate member 12a), an upstanding generally vertical leg portion 72 which defines a board receiving slot between it and the facing surface of the adjacent rib 22a and terminating in an upwardly, outwardly projecting sealing lip 74 extending over the slot.

The end of the gasket 68 adjacent the pluggable connector 58 defines a generally rectangular portion 76 having an upwardly projecting wedge-shaped crown 78. The outer dimensions of the sealing lip 74 of the gasket member 68 are such as to be deformably received in a sealingly biased condition within the spacial separation of the board pair assembly 11 with the arcuate sealing nose portion 80 of the receiving end deformed to be sealingly received within the arcuate portion of the U-shaped upright member 60 and the wedge-shaped projection on the opposite end sealingly engaging the under surface of the inset forward strut 56 adjacent the connector end. It is noticed that the rounded nose portion 80 of the sealing lip 74 includes a slit 82 to prevent wrinkles in the nose as it assumes a lesser arcuate extent when compressed within the U-shaped upright 60 to more effectively seal with the inner surfaces of the upright.

The planar strip 64 supporting the gasket is easily slideably removable from the plate 12a, and upon insertion into the undercut slits 62 is seated therein by the end adjacent the connectors abutting a frame member 16 and by a dimple 84 and socket 86 arrangement between the strip 64 and the plate 12a to also maintain the strip 64 within the assembled arrangement when the board pair assembly is removed. However, under deliberate manual force, the strip 64 can easily be removed and a new strip with a new rubber seal 68 vulcanized thereto inserted whenever the existing seal needs to be replaced. Also, the initial fabrication of the seal is facilitated as compared to that of the described prior art in that the sealing blocks adjacent each end of the aperture for mating sealing engagement with the struts of the board pair assembly are no longer a part of the present seal structure in that the end seals configuration of the present invention are formed as an integral portion, namely the end seals are provided by the upper surface 78, wedge-shaped rectangular member 76 at one end and the arcuate nose portion 80 at the opposite end. Both are biased into sealing engagement with the strut or the U-shaped vertical member when the board pair assembly 11 is fully inserted into the modular frame assembly.

Thus, an easily replaceable air seal is provided for sealingly engaging the internal surfaces of a board pair assembly of a modular circuit board plug-in assembly to direct cooling air flow in the space defined between the boards of the assembly to cool the electrical components projecting into this space. Also, it is contemplated that under certain conditions a solid strip (one of the removable strips 64 without any aperture therethrough) may be inserted within opposite grooves of opposed plates 12 and 14 when the board pair assembly generally associated with such groove is not going to be replaced. Such space will then remain empty and it will be unnecessary to deposit therein a dummy board pair assembly to direct the air flow therethrough as the solid strips will prevent cooling air from entering through the plate aperture 40a.

I claim:

1. In an assembly removably containing aligned spaced board members mounted between opposed plate members forming a part of the assembly and said assembly having means for indexed receipt of said board members providing a separation space between the board members, an aperture in each of said opposed plate members disposed to permit cooling air flow between selected adjacent spaced board members, and sealing means mounted on opposed facing surfaces of said plate members for sealingly engaging opposed facing surfaces of said selected adjacent boards to prevent the cooling air delivered to the separation space between the board members from leaking between the board members and said plate members, an improvement of each said sealing means comprising:
   a planar strip slidingly retained on each said plate member, said strip having an aperture therethrough in alignment with said aperture in each said plate member and a resilient rubber-like seal ring bonded to each said strip and encircling said aperture in each said plate member and defining a peripheral surface having a dimension in the unbiased position generally larger than the spatial separation of said adjacent board members and deformable to a sealing engagement inherently biased against said board members within said assembly, and means for normally retaining each said strip in proper position on each said plate member.

2. An assembly according to claim 1 wherein said board members comprise printed circuit boards with said selected adjacent boards pre-assembled in spaced relationship and attached to vertical struts generally perpendicular to said plate members and wherein said sealing means also provides structure sealingly engaging said strut members.

3. An assembly according to claim 2 wherein each said planar strip is slidingly retained on each said plate member in a tongue-in-groove arrangement and wherein each said planar strip, in addition to said board members, is inserted from a common side of said assembly.

4. An assembly according to claim 2 wherein said resilient rubber-like seal ring comprises a silicone rubber vulcanized directly onto each said strip.

5. An assembly according to claim 4 wherein said opposed plate members define opposed facing upstanding ribs and each said rubber-like seal ring includes an upstanding planar portion cooperating with one said rib to define a board receiving groove.

* * * * *